(12) United States Patent
Tachibana

(10) Patent No.: US 8,414,999 B2
(45) Date of Patent: Apr. 9, 2013

(54) SUCTION SHEET

(75) Inventor: Toshimitsu Tachibana, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/121,328

(22) PCT Filed: Sep. 25, 2009

(86) PCT No.: PCT/JP2009/066656
§ 371 (c)(1),
(2), (4) Date: Mar. 28, 2011

(87) PCT Pub. No.: WO2010/035786
PCT Pub. Date: Apr. 1, 2010

(65) Prior Publication Data
US 2011/0183108 A1 Jul. 28, 2011

(30) Foreign Application Priority Data
Sep. 29, 2008 (JP) .................................. 2008-250761

(51) Int. Cl.
*B32B 3/24* (2006.01)
(52) U.S. Cl.
USPC ......................................... 428/137; 428/138
(58) Field of Classification Search .................. 428/137, 428/138
See application file for complete search history.

(56) References Cited

U.S. PATENT DOCUMENTS
2008/0075935 A1 * 3/2008 Iida et al. ...................... 428/206

FOREIGN PATENT DOCUMENTS

| JP | 51-101474 | 8/1976 |
|---|---|---|
| JP | 56-015994 | 2/1981 |
| JP | 63-032849 | 3/1998 |
| JP | 2001-353788 | 12/2001 |
| JP | 2002-144270 | 5/2002 |
| JP | 2002-173250 | 6/2002 |
| JP | 2003-086667 | 3/2003 |
| JP | 2004-095831 | 3/2004 |
| JP | 2006-026981 | 2/2006 |

\* cited by examiner

*Primary Examiner* — William P Watkins, III
(74) *Attorney, Agent, or Firm* — Hamre, Schumann, Mueller & Larson, P.C.

(57) ABSTRACT

A suction sheet (1) to be attached onto a suction surface (4*a*) of a suction apparatus (4) that holds an object by vacuum suction is provided with a substrate (2) and a porous body (3). The substrate (2) has one surface (2*a*) and the other surface (2*b*), and the one surface (2*a*) is brought into contact with the suction surface (4*a*). Further, a plurality of through holes (21) are provided in the substrate (2). The porous body (3) has a thickness of 1.4 mm or less, and is adhered onto the other surface (2*b*) of the substrate (2) so as to cover the through holes (21).

5 Claims, 2 Drawing Sheets

SUCTION SHEET

TECHNICAL FIELD

The present invention relates to a suction sheet to be mounted on a suction apparatus that holds an object by vacuum suction.

BACKGROUND ART

Conventionally, a suction apparatus that holds an object by vacuum suction has been used, for example, in a step for processing a thin light sheet or film, such as metal foil, plastic film and green sheet. Such a sheet or film is fixed or conveyed by this suction apparatus. An air permeable porous sheet is adhered onto the suction surface of the suction apparatus, for example, for protection of the object (for example, see Patent Literature 1).

Citation List
Patent Literature
  Patent Literature 1: JP 2001-353788 A

SUMMARY OF INVENTION

Technical Problem

In the case where the object is a thin light sheet or film, the surface shape of the porous sheet is transferred to the object in the vacuum suction, and the transfer marks cause adverse effects on the performance or appearance of the final product in some cases. In order to prevent the formation of such transfer marks, it is conceivable that the suction rate is reduced to decrease the pressure difference caused by the vacuum drawing. However, in this case, since a conventional porous sheet is comparatively thick (for example, 2 mm in the example of Patent Literature 1), the air is drawn also through the side surfaces of the porous sheet, resulting in failure to obtain a sufficient suction force due to the influence of the lateral leakage.

As a possible solution to this problem, the lateral leakage may be reduced by use of a porous sheet with a reduced thickness. In this way, it is possible to obtain a sufficient suction force with a low suction rate. However, such a suction apparatus is generally provided with a recess for suction formed on its suction surface. Therefore, in the case of using the porous sheet with a reduced thickness, the porous sheet is significantly deformed upon the suction such that the sheet is drawn into the recess because of its low rigidity. Thus, the edge of the recess on the suction surface is strongly pressed against the object through the porous sheet, which causes suction marks to be formed on the object.

In view of such circumstances, the present invention aims to provide a suction sheet capable of reducing the lateral leakage and suppressing the formation of suction marks on the object.

Solution to Problem

For achieving the aforementioned purpose, the present invention provides a suction sheet to be attached onto a suction surface of a suction apparatus that holds an object by vacuum suction. The suction sheet is provided with: a substrate that has a plurality of through holes formed therein and one surface to be brought into contact with the suction surface; and a porous body with a thickness of 1.4 mm or less that is adhered onto the other surface of the substrate so as to cover the plurality of through holes.

Advantageous Effects of Invention

According to the above-mentioned configuration, the porous body is as thin as 1.4 mm or less. Thus, it is possible to reduce air suction through the side surfaces of the porous body, that is, the lateral leakage. Moreover, this porous body is adhered to the substrate provided with through holes formed therein. Therefore, a reduction in the size of the through holes leads to a reduction in the deformation of the porous body, where the porous body deforms such that it is drawn in the through holes due to suction. As a result, it is possible to suppress the edges of the through holes from being pressed against the object. Accordingly, the present invention makes it possible to reduce the lateral leakage and suppress the formation of suction marks on the object.

DESCRIPTION OF EMBODIMENTS

Hereinafter, the best mode for carrying out the present invention is described in detail with reference to the drawings.

Figure 1:
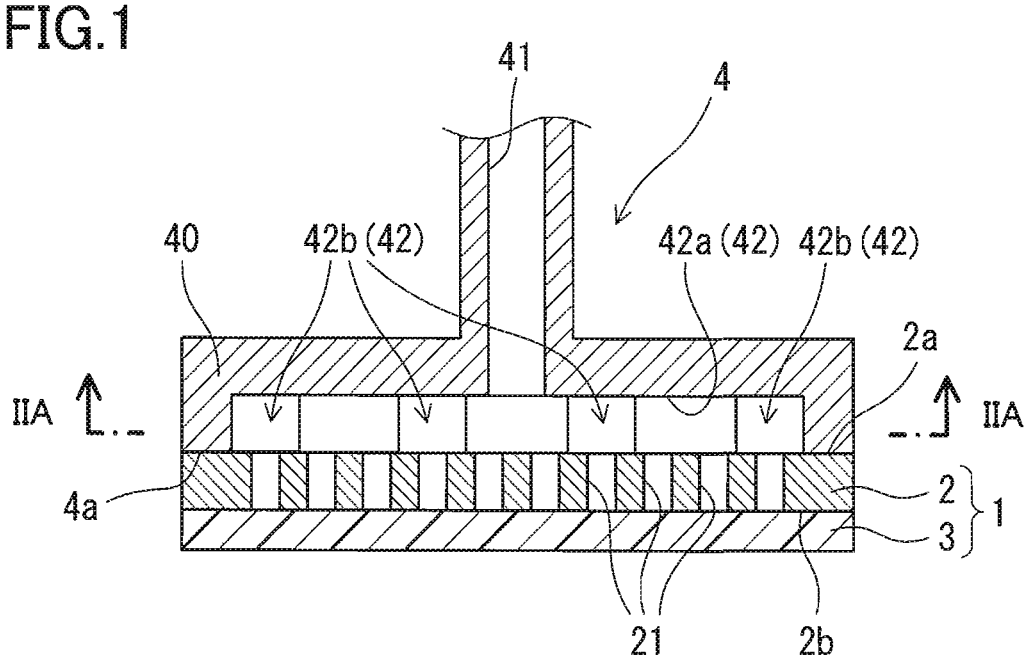
FIG. 1 is a sectional view showing a state in which a suction sheet according to one embodiment of the present invention is attached onto the suction surface of a suction apparatus.

FIG. 1 shows a state in which a suction sheet 1 according to one embodiment of the present invention is attached onto a suction surface 4a of a suction apparatus 4. The suction apparatus 4 is configured to convey an object while holding it by vacuum suction and is provided with a suction head 40 shown in FIG. 1, a moving mechanism (not shown) for moving the suction head 40 up and down, a shifting mechanism (not shown) for shifting the suction head 40 in the horizontal direction, and a vacuum pump (not shown) connected to the suction head 40 through a suction path 41. Further, the lower surface of the suction head 40 in parallel to the horizontal plane serves as the suction surface 4a that allows the object to be held thereon by suction. It should be noted that the suction sheet 1 can be mounted not only on the suction apparatus 4 that conveys an object but also on another suction apparatus having a function of holding an object by vacuum suction (for example, processing apparatuses such as a polishing apparatus and a dicing apparatus) in a wide range of applications.

Figure 2A:
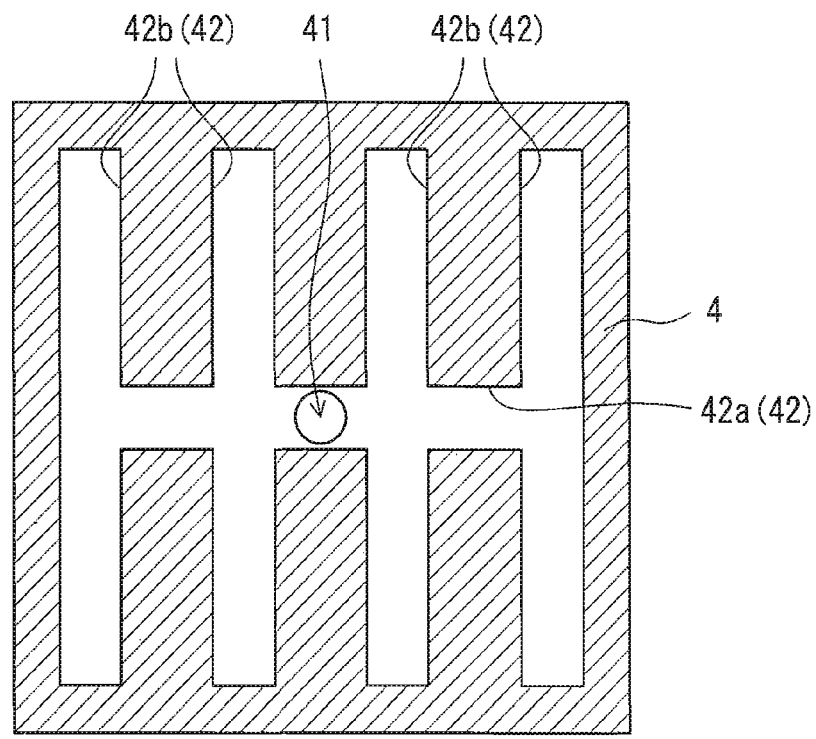
FIG. 2A is a sectional view taken along the line IIA-IIA in FIG. 1.

On the suction surface 4a, a recess 42 for suction is provided, and the suction path 41 opens on the bottom surface of the recess 42. In this embodiment, the recess 42 is formed by one transverse groove 42a extending toward both sides from the suction path 41, and four longitudinal grooves 42b each extending toward the other two sides from the transverse groove 42a, as shown in FIG. 2A. The grooves 42a and 42b each have a width, for example, of 10 mm. However, the shape of the recess 42 is not limited to this, and can be appropriately selected. For example, the recess 42 may be formed by a groove in the form of a cross and a groove in the form of a frame that surrounds this cross. Alternatively, the recess 42 may be formed, for example, by a plurality of circular bottomed holes arranged in the form of a matrix on the suction surface 4a.

The suction sheet 1 has a size such that the suction sheet 1 can close the recess 42 (for example, a size approximately equal to that of the suction surface 4a or slightly smaller than it). The suction sheet 1 is fixed to the suction surface 4a, for example, using double-sided adhesive tape. The suction sheet 1 is provided with: a substrate 2 having one surface 2a (which is the upper surface in FIG. 1) to be brought into contact with the suction surface 4a and the other surface 2b (which is the lower surface in FIG. 1); and a porous body 3 adhered onto the other surface 2b of the substrate 2.

The substrate 2 needs only to have an appropriate rigidity (for example, a rigidity modulus (modulus of transverse elasticity) of about 1 MPa to 300 GPa), and the material thereof is not particularly limited. For example, a plastic plate made of polyethylene, polypropylene, polystyrene, polycarbonate, polyethylene terephthalate etc., a metal plate made of stainless steel, aluminium etc., or a rubber plate made of silicone rubber, nitrile rubber, ethylene propylene rubber, urethane rubber, natural rubber etc. can be used as the substrate 2. Further, the thickness of the substrate 2, for example, is 0.3 to 30 mm in the case of a plastic plate or rubber plate, and 0.2 to 20 mm in the case of a metal plate.

Figure 2B:
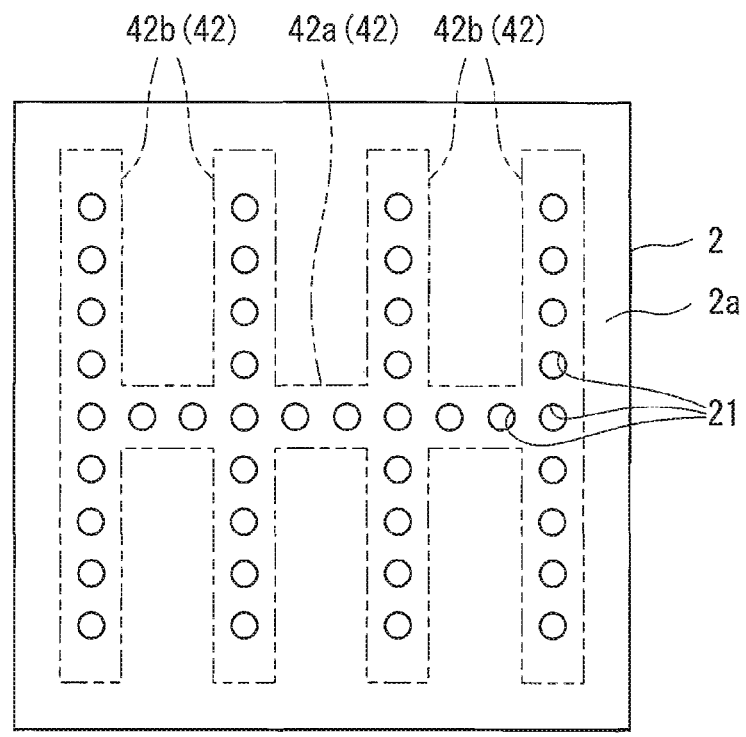
FIG. 2B is a plan view showing a substrate.

In the substrate 2, a plurality of through holes 21 extending through the substrate 2 in the thickness direction thereof are provided within a region corresponding to the recess 42, as shown in FIG. 2B. In this embodiment, the through holes 21 are provided only within the region corresponding to the recess 42. However, the through holes 21 may be provided over the entire surface of the substrate 2 in a regular or random pattern. In this case, through holes in the other region that do not correspond to the recess 42 are only to be closed by the suction surface 4a. However, it is more preferable that the through holes 21 be formed only within the region corresponding to the recess 42, as this embodiment, in view of the processing efficiency and the stabilization of the suction force during suction.

The through holes 21 are preferably arranged so that the distance between the center of each individual through hole 21 and the center of its adjacent through hole 21 closest thereto should be 90 mm or less. In order to achieve this, the through holes 21 are arrayed on the center lines of all the grooves 42a and 42b with a pitch of 10 mm that satisfies the above-mentioned condition of 90 mm or less, so that the distance between the centers of each adjacent pair of through holes 21 is set to 10 mm, in this embodiment. It should be noted that, in the case where the through holes 21 are arranged in the form of a matrix, the row and column pitch may be set to 90 mm or less as mentioned above. The distance between the center of each individual through hole 21 and the center of its adjacent through hole 21 closest thereto is more preferably 65 mm or less.

The through holes 21 each are preferably provided with a size smaller than the recess 42, that is, a size such that each through hole 21 does not extend over the recess 42 in plan view. Specifically in view of reducing the deformation of the porous body 3 during suction, each through hole 21 preferably has an opening area (cross-sectional area in a direction orthogonal to the axis direction) of 64 mm$^2$ or less (for example, with each side of 8 mm or less in the case of the through hole 21 in a square shape, and with a diameter of about 9 mm or less in the case of the through hole 21 in a circular shape), more preferably has an opening area of 30 mm$^2$ or less. Furthermore, each through hole 21 preferably has a size equal to or larger than a circle with a diameter of 0.5 mm, more preferably has a size equal to or larger than a circle with a diameter of 1.0 mm, most preferably has a size equal to or larger than a circle with a diameter of 1.5 mm so that the air can flow through the through holes 21 smoothly even when the suction rate of the suction apparatus 4 is decreased. Further, each through hole 21 may have a rectangular, ellipsoidal shape or the like, as viewed in the axis direction. However, it preferably has a circular shape in view of workability.

The porous body 3 is adhered onto the other surface 2b of the substrate 2 so as to cover all the through holes 21. The porous body 3 needs only to be in the form of a porous sheet. Examples thereof include woven fabrics, nonwoven fabrics, a perforated film and a sintered sheet body that has been made porous by sintering plastic powder. Above all, the sintered sheet body of plastic powder is preferably used, in view that the problem of deposition of foreign matters on the object due to fallen fibers, etc. can be prevented, and the holes are present uniformly over the entire surface so that it is easy to obtain a uniform suction force over the entire surface. Furthermore, since friction occurs between the porous body 3 and the object in use, a sintered sheet body produced using ultrahigh molecular weight polyethylene powder with an average molecular weight of at least 500,000 is preferable in view of its excellent abrasion resistance and impact resistance.

In order to produce such a sintered sheet body using ultrahigh molecular weight polyethylene powder, the following methods, etc. are available. The first method is a method in which a sintered block is produced by sintering the powder put into a mold, and then the sintered block is formed into a sheet by lathe turning. The second method is a method in which the powder is sintered in a state where the powder is spread to a specific thickness. The third method is a method in which a so-called slurry obtained by dispersing the powder in a solvent is applied, to a specific thickness, onto a metal plate with the surface subjected to mold release treatment, and then it is heated to the melting point or more of ultrahigh molecular weight polyethylene so as to be sintered.

The thickness of the porous body 3 is preferably at least 0.05 mm but not more than 1.4 mm. This is because the thickness less than 0.05 mm makes adverse effects, such as a damage of the porous body 3, likely to occur, whereas the thickness exceeding 1.4 mm makes air suction through the side surfaces of the porous body 3, so-called lateral leakage, significant, though the bending elastic modulus of the porous body 3 differs depending on the production method, etc., and accordingly the degree of the deformation during suction differs due to this. The thickness of the porous body 3 is more preferably at least 0.05 mm but not more than 1.0 mm.

The air permeability of the porous body 3 is preferably at least 0.1 cm$^3$/cm$^2$/s but not more than 300 cm$^3$/cm$^2$/s, in terms of Frazier Number. The Frazier Number herein means a numerical value measured using a Frazier air permeability tester prescribed in JIS L 1096. The air permeability is more preferably at least 0.5 cm$^3$/cm$^2$/s but not more than 100 cm$^3$/cm$^2$/s.

Furthermore, the relationship between the size of the through hole 21 in the substrate 2 and the thickness of the porous body 3 preferably satisfies $B/A^2 \geq 0.015$, where the maximum length of the sides of the minimum rectangular frame that circumscribes the contour of the through hole 21 as viewed in the axis direction is referred to as A, and the thickness of the porous body 3 is referred to as B, under the condition that the thickness of the porous body 3 falls within the range of 0.05 to 1.4 mm as mentioned above. In the case where the through hole 21 is circular, A is equal to the diameter of the through hole 21. The $B/A^2$ less than 0.015 might cause the porous body 3 to deform significantly due to suction, though it depends also on the material or structure of the porous body 3. The $B/A^2$ is more preferably at least 0.025, most preferably 0.025 to 0.040, under the condition that the thickness of the porous body 3 falls within the range of 0.05 to 1.4 mm.

The method for bonding the porous body 3 to the substrate 2 is not particularly limited as long as it is a method that does not cause the through holes 21 and the voids inside the porous body 3 to be closed, and ensures the air flow through the through holes 21. For example, heat fusion, heat welding with a hot melt sheet, adhesion with a double-sided adhesive tape or adhesive agent can be used therefor. In the case of using an adhesive agent, it is possible to ensure air permeability by forming spaces where the adhesive agent is locally absent such that it is in a porous state, even if adhesive agent is applied onto the entire surface of the porous body 3. Alternatively; it also is possible that, while the size of the porous body 3 is set to the extent that the porous body 3 extends over the substrate 2, the extending portion is bent over the edges of the substrate 2 so as to be fixed onto the side surfaces of the substrate 2 with an adhesive tape, adhesive agent, etc.

According to the adhesive sheet 1 having the above-described configuration, it is possible to reduce air suction through the side surfaces of the porous body 3, that is, so-called lateral leakage, by use of the porous body 3 that is as thin as 1.4 mm or less. Moreover, this porous body 3 is adhered to the substrate 2 provided with through holes 21 formed therein. Therefore, a reduction in the size of the through holes 21 leads to a reduction in the deformation of the porous body 3, where the porous body 3 deforms such that it is drawn in the through holes 21 due to suction. As a result, it is possible to suppress the edges of the through holes 21 from being pressed against the object. This makes it possible to suppress the formation of suction marks on the object.

EXAMPLES

Hereinafter, the present invention is described in detail with reference to examples. However, the present invention is not restricted by these examples at all.

Examples

A mold with an internal diameter of 500 mm and a height of 500 mm was filled with ultrahigh molecular weight polyethylene powder (with a molecular weight of 5,000,000, a bulk density of 0.47 g/cm$^3$ and an average particle size of 120 μm). This was put in a metal pressure vessel, and then the pressure inside the vessel was reduced to 10 hPa. Thereafter, the inside of the vessel was adjusted to 160° C. and 6080 hPa by introducing heated water vapor into the vessel, which was heated for 5 hours and then slowly cooled. Thus, a cylindrical sintered block was obtained. This sintered block was cut into sintered sheet bodies with various thickness by lathe turning, each of which was cut into a 100 mm square. These sintered sheet bodies were pressed at 130° C. and 30 Pa for 1 hour by a press machine, so that porous bodies with a thickness varying from 0.025 to 1.0 mm were produced.

For each porous body, the bulk density was calculated from its volume and weight, and the porosity was calculated by the formula $\{1-(\text{bulk density/true density})\} \times 100$, taking the true density of the ultrahigh molecular weight polyethylene as 0.935 g/cm$^3$, 2 mm thick and 100 mm square polyethylene plates or aluminium plates were prepared, and circular through holes with a diameter varying from 1.5 to 6.0 mm were formed therethrough as shown in FIG. 2B. Thus, a plurality of types of substrates were produced. The porous bodies were adhered respectively to the substrates. Thus, suction sheets were obtained (Examples 1 to 8).

The porous bodies were bonded to the substrates with a double-sided adhesive tape (No. 5606: manufactured by NITTO DENKO CORPORATION) that used PET as a base material. The double-sided adhesive tape was adhered onto the entire surface of each polyethylene plate or aluminium plate before perforation, and then the plate was perforated over the double-sided adhesive tape so that the closure of the through holes by the double-sided adhesive tape was avoided.

Comparative Example

A 1.5 mm thick porous body was produced in the same manner as in the examples except that the thickness of the sintered sheet body to be cut out from the sintered block was increased. This was adhered to a substrate (polyethylene plate) in which through holes each having a diameter of 6.0 mm are provided, in the same manner as in the examples. Thus, a suction sheet was obtained. The porosity of the porous body was calculated in the same manner as in the examples, Evaluation For each of the suction sheets of Examples 1 to 8 and Comparative Example, the B/A$^2$ was calculated from the thickness B of the porous body and the diameter A of each through hole in the substrate.

Further, the suction sheet was mounted on a suction apparatus having a conveying function, which was subjected to a suction test using an aluminium foil with a thickness of 10 μm. As the suction test, the suction rate was set to 10 L/min, a cyclic series of the suction, conveying and detachment of the aluminium foil was repeated 100 times between two tables, out of which the number of suction failure was counted. Further, the surface of the aluminium foil after the test was observed, and the presence or absence of suction marks remaining thereon was checked by visual inspection.

Table 1 shows the specification data, the B/A$^2$ and the test results for each suction sheet.

TABLE 1

| | Porous body | | Substrate | | | Suction test | |
| | | | | Hole | | | |
| | Thickness B (mm) | Porosity (%) | Base material | diameter A (mm) | B/A$^2$ | The number of suction failure | Status of suction marks |
|---|---|---|---|---|---|---|---|
| EX. 1 | 0.3 | 29 | PE plate | 3.0 | 0.033 | 0 | ○ |
| EX. 2 | 0.32 | 29 | PE plate | 4.5 | 0.016 | 0 | ○ |
| EX. 3 | 0.05 | 32 | PE plate | 1.5 | 0.022 | 0 | ○ |
| EX. 4 | 1.0 | 27 | PE plate | 6.0 | 0.028 | 0 | ○ |
| EX. 5 | 0.3 | 29 | Al plate | 3.0 | 0.033 | 0 | ○ |
| EX. 6 | 0.3 | 29 | PE plate | 6.0 | 0.008 | 0 | Δ |
| EX. 7 | 0.025 | 33 | PE plate | 1.5 | 0.011 | 0 | Δ |
| EX. 8 | 1.0 | 27 | PE plate | 1.5 | 0.444 | 1 | ○ |
| C.EX. | 1.5 | 27 | PE plate | 6.0 | 0.042 | 6 | ○ |

In the column of the table that indicates the status of suction marks, ○ represents a good status, and Δ represents a status where a few suction marks were left.

It can be seen from Table 1 that the conveyance of the aluminium foil was well carried out in general in Examples 1 to 8 (particularly well in Examples 1 to 7), though a few suction marks were left in Examples 6 and 7 having a B/A$^2$ of less than 0.015. In Examples 2 and 3 having a B/A$^2$ of less than 0.025, a slight deformation of the aluminium foil, but not so far as to be recognized as suction marks, was observed. In contrast, in Comparative Example with the porous body having a thickness exceeding 1.4 mm, a sufficient suction force was not obtained and problematic suction failures occurred, as already described in the section of Technical problem.

The invention claimed is:

1. A suction sheet to be attached onto a suction surface of a suction apparatus that holds an object by vacuum suction, comprising:
   a substrate that has a plurality of through holes formed therein and one surface to be brought into contact with the suction surface;
   a porous body with a thickness of 1.4 mm or less that is adhered onto a surface of the substrate other than the surface to be brought into contact with the suction surface so as to cover the plurality of the through holes of the substrate, wherein the plurality of the through holes of the substrate are arranged so that a distance between a center of each individual through hole and a center of its adjacent through hole closest thereto is 65 mm or less, the plurality of the through holes each have an opening area of 64 mm² or less, and a formula: $B/A^2 \geqq 0.015$ is satisfied, wherein A is a maximum length of sides of a minimum rectangular frame that circumscribes a contour of the through hole as viewed in an axis direction, and B is a thickness of the porous body.

2. The suction sheet according to claim 1, wherein
the porous body is made of ultrahigh molecular weight polyethylene.

3. The suction sheet according to claim 2, wherein
the porous body has been made porous by sintering ultrahigh molecular weight polyethylene powder.

4. The suction sheet according to claim 1, wherein
the substrate is a plastic plate or a metal plate.

5. The suction sheet according to claim 1, wherein
the plurality of the through holes are provided within a region of the substrate corresponding to a recess formed in the suction surface of the suction apparatus, and a size of the plurality of the through holes is smaller than a size of the recess.

\* \* \* \* \*

UNITED STATES PATENT AND TRADEMARK OFFICE
CERTIFICATE OF CORRECTION

PATENT NO. : 8,414,999 B2
APPLICATION NO. : 13/121328
DATED : April 9, 2013
INVENTOR(S) : Tachibana et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 7 days.

Signed and Sealed this
Twelfth Day of November, 2013

Teresa Stanek Rea
*Deputy Director of the United States Patent and Trademark Office*